United States Patent [19]

Horner et al.

[11] 4,016,552
[45] Apr. 5, 1977

[54] DUAL POLARITY PULSE DETECTION CIRCUIT WITH VARIABLE VOLTAGE THRESHOLD

[75] Inventors: James F. Horner, Santa Clara; William D. Jackson, San Jose, both of Calif.

[73] Assignee: Hewlett-Packard Company, Palo Alto, Calif.

[22] Filed: Sept. 12, 1975

[21] Appl. No.: 613,008

[52] U.S. Cl. .................. 340/253 C; 307/267; 328/58; 328/127; 328/148; 340/248 A; 340/253 R; 340/253 P;
[51] Int. Cl.² ........................... G08B 21/00
[58] Field of Search ........... 340/248, 253; 328/58, 328/127, 148; 307/234, 267, 229, 235 C, 235 F

[56] References Cited

UNITED STATES PATENTS

| 3,184,729 | 5/1965 | Freedman et al. ............... 340/248 |
| 3,448,296 | 6/1969 | Schwaninger .................... 307/267 |
| 3,718,864 | 2/1973 | Kelly et al. ...................... 307/290 X |
| 3,845,401 | 10/1974 | Troiani et al. .................. 328/148 X |

Primary Examiner—John W. Caldwell
Assistant Examiner—Daniel Myer
Attorney, Agent, or Firm—Robert S. Hulse

[57] ABSTRACT

A circuit having a variable voltage source and a comparator with feedback capability detects high-speed input pulses of positive and negative polarities relative to selected voltage thresholds. The circuit also stretches and displays the detected pulses utilizing pulse stretching and LED circuitry.

5 Claims, 3 Drawing Figures

DUAL POLARITY PULSE DETECTION CIRCUIT WITH VARIABLE VOLTAGE THRESHOLD

BACKGROUND OF THE INVENTION

High-speed pulse detection circuits and logic status indicator circuits generally comprise a plurality of circuit elements such as high-speed amplifiers, high-speed comparators, and monostable multivibrators containing numerous logic gates. The high-speed amplifiers are generally added to circuits to increase the speed of response of such circuits to input signals. Such additions, however, usually increase the complexity of such circuits resulting in higher circuit manufacturing costs and in decreased circuit reliability.

Also, multivibrators employed in some circuits often comprise numerous logic gates that contribute significantly to the propagation delay of signals through the circuit. Generally, the greater the number of such logic elements in a circuit, the slower is that circuit's response to input signals.

High-speed pulse detection circuits and logic status indicator circuits often comprise complex and costly dual circuits: one circuit for detecting and stretching input pulses having a positive polarity and another circuit for detecting and stretching input pulses having a negative polarity. Pulse-stretching is performed to facilitate observation of the pulses.

To enable a user of such circuits to select, and subsequently vary, the threshold relative to which the input pulses are to be detected, many such circuits include a comparator Schmitt trigger or the like as an added circuit element. This added element not only further increases the complexity and cost of such circuits, but often decreases the reliability of such circuits as well.

SUMMARY OF THE INVENTION

Accordingly, the preferred embodiment of the present invention is a circuit having a comparator with variable threshold selector circuitry for high-speed detection of pulses having positive or negative polarity relative to a selected threshold. The circuit includes pulse stretching and LED circuitry for stretching and displaying the detected input pulses.

The comparator in the circuit obviates the need for multivibrators with numerous logic gates and for a Schmitt trigger or the like as a separate circuit element. As such, the circuit comprises fewer elements and is simpler, less costly and more reliable than conventionally available high-speed pulse detection or logic status indicator circuits for detecting high-speed input pulses relative to a variable threshold.

DESCRIPTION OF THE PREFERRED EMBODIMENT

Figure 1:
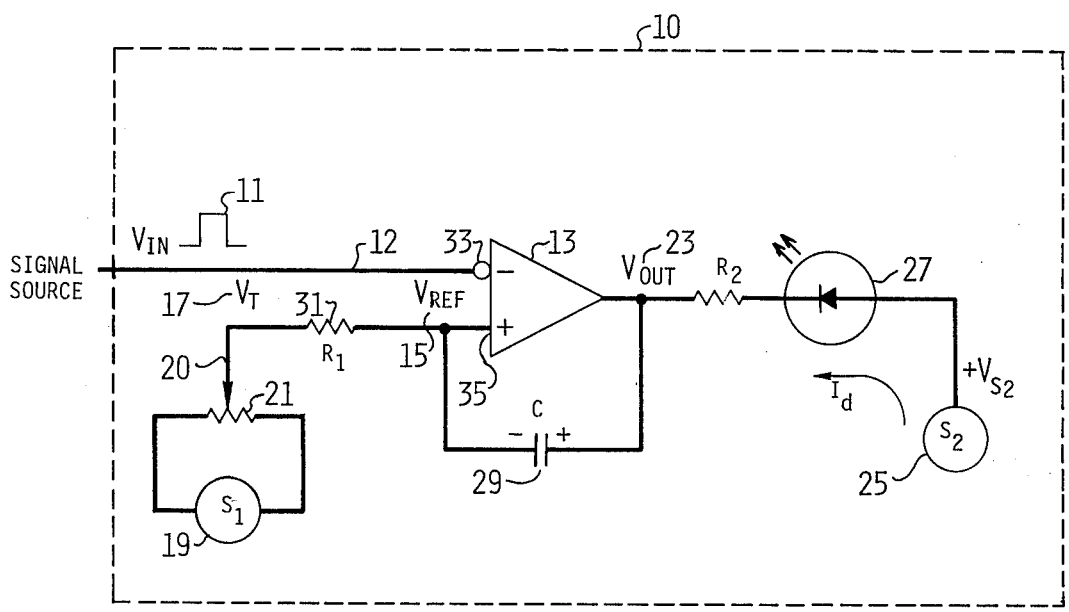
FIG. 1 is a schematic diagram of the preferred embodiment of the circuit of the present invention.

FIG. 1 shows a circuit diagram of a simple high-speed pulse-detection and logic-state analyzing circuit 10 with pulse stretching and display capability. Circuit 10 produces a visible indication of the status of the voltage level of an input pulse with respect to a reference voltage level. An input pulse of undetermined voltage 11 is supplied via a line 12 to a negative terminal 33 of a high-speed comparator 13 in the circuit 10. The high-speed comparator may be the Motorola model No. MC10125 ECL-to-TTL comparator or other commerically available comparator. A reference signal having a reference voltage 15 is supplied to a positive terminal 35 of the comparator 13. When no input voltage is applied to comparator 13, the circuit 10 is in a quiescent state having reference voltage 15 equal to a threshold or trigger voltage 17 produced by a power source 19. This threshold voltage 17 is variable, and may be manually varied by changing the position of a wiper contact 20 of a potentiometer 21. When circuit 10 is not in a quiescent state, i.e., when an input voltage 11 is applied to comparator 13, comparator 13 either produces no output signal, in which event the output voltage $V_{OUT}$ from comparator 13 is low, or it produces an output signal having a voltage $V_{OUT}$ which is high, i.e., set to a predetermined value, for example, 2.5 volts. This predetermined value is determined as follows:

$$V_{OUT} = V_{S2} - (I_d \times R_2)$$

where $V_{S2}$ is the voltage, in volts, of a power supply $(S_2)25$, $I_d$ represents the amount of current, in milliamperes, needed to drive a typical LED which may have ten millicandelas luminous intensity, and $R_2$ represents a resistance, typically about 240 ohms, of a resistor in series with said LED.

Figure 2:
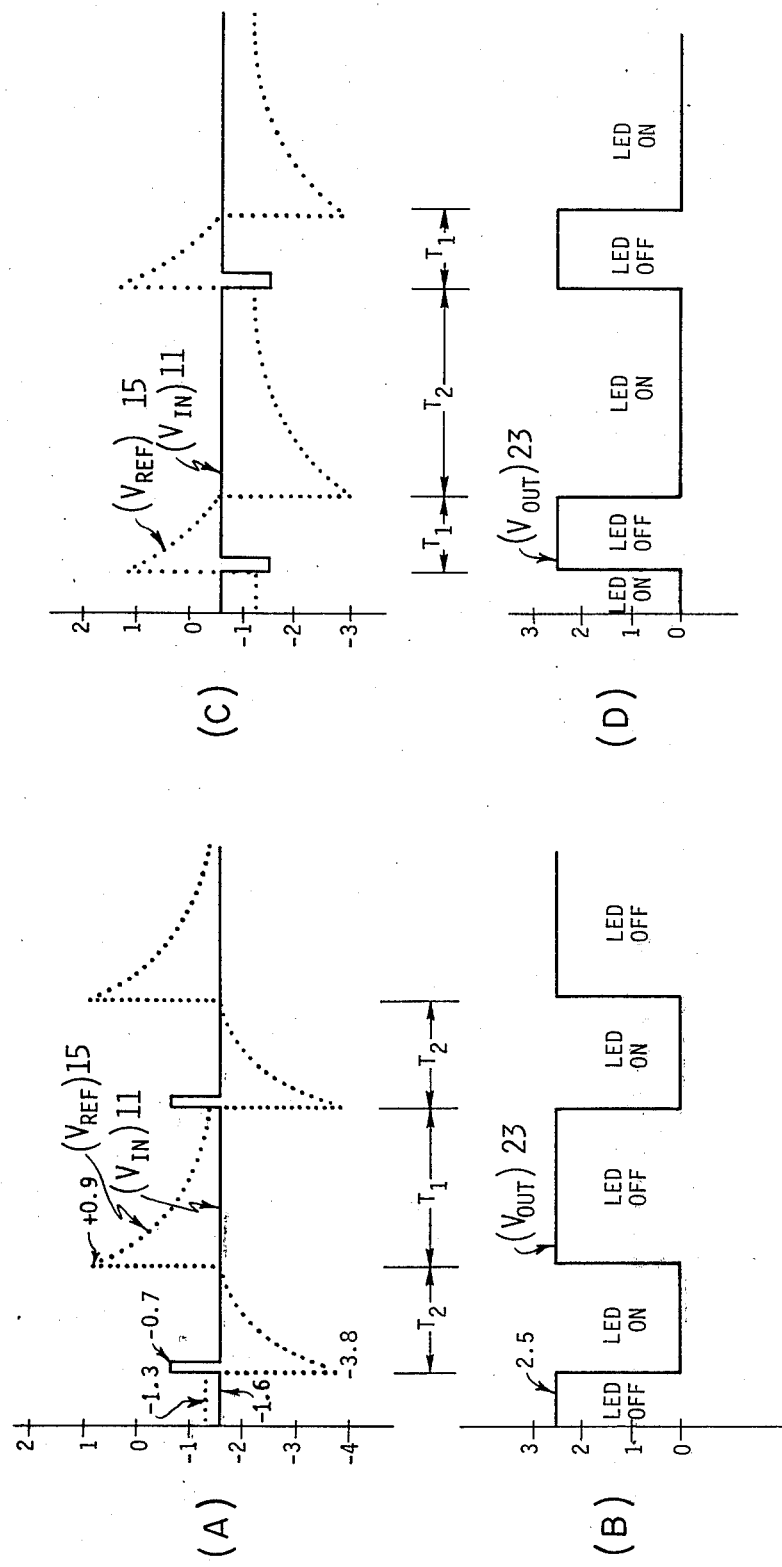
FIG. 2 is a graphic illustration of the signal detection, signal stretching and display characteristics of the circuit of FIG. 1.

FIG. 2 illustrates the relationship of the input voltage 11 to reference voltage 15 and the effect of this relationship upon the on and off status of an LED display 27. FIG. 2(B) relates LED status to input and reference voltage levels shown in FIG. 2(A). FIG. 2(D) relates LED status to the input and reference voltage levels shown in FIG. 2(C).

A positive input pulse is a pulse which attains a voltage level more positive than reference voltage 15, and a negative input pulse is a pulse which attains a voltage level more negative than reference voltage 15. A positive input pulse causes comparator 13 to produce an output pulse 23 having a voltage $V_{OUT}$ that is low. This causes current to flow from power supply 25 through LED 27, thereby lighting or turning on the LED 27. A negative input pulse causes comparator 13 to produce an output pulse 23 whose voltage $V_{OUT}$ is equal to or greater than the voltage produced by power supply 25. This prevents current from flowing through LED 27 from power supply 25, thereby causing LED 27 to be off or not lit.

For repetitive signals comprising positive and negative input pulses, and sinusoidal or direct current signals with voltage levels that repetitively become more positive and more negative than reference voltage 15, the LED 27 blinks on and off repetitively.

A capacitor 29 is included in the circuit for stretching short duration pulses, i.e., pulses of approximately five nanoseconds to ten milliseconds in width in the preferred embodiment, to produce longer duration pulses that are greater than ten milliseconds in width. This stretching operation is performed so that the existence and the repetitive characteristics of the short duration pulses may be visually observed. As $V_{OUT}$ goes high, capacitor 29 causes the reference voltage 15 to become more positive relative to the voltage of input pulse 11. This in turn causes the comparator output 23 to remain high for the decay period $T_1$ of capacitor 29 and a resistor 31, which period is defined as follows:

$$T_1 = -R_1 C \ln \frac{V_{IN} - V_T}{V_{OUT}MAX - V_{OUT}MIN}$$

where $R_1$ represents the resistance, in ohms, of resistor 31,

C represents the capacitance, in microfarads, of capacitor 29, $V_{IN}$ represents the voltage, in volts, of input pulse 11, $V_T$ represents the value, in volts, of threshold voltage 17, $V_{OUT}MAX$ represents the maximum value, in volts, of output voltage 23 of comparator 13, and $V_{OUT}MIN$ represents the minimum value, in volts, of output voltage 23 of comparator 13.

When $V_{OUT}$ goes low, capacitor 29 causes reference voltage 15 to become more negative with respect to the voltage of input pulse 11. This in turn causes the comparator output 23 to remain low for decay period $T_2$ of the capacitor 29, which period is defined as follows:

$$T_2 = R_1 C \ln \frac{V_T - V_{IN}}{V_{OUT}MAX - V_{OUT}MIN}$$

where $R_1$, C, $V_{IN}$, $V_{OUT}MAX$ and $V_{OUT}MIN$ are as defined above.

Figure 3:
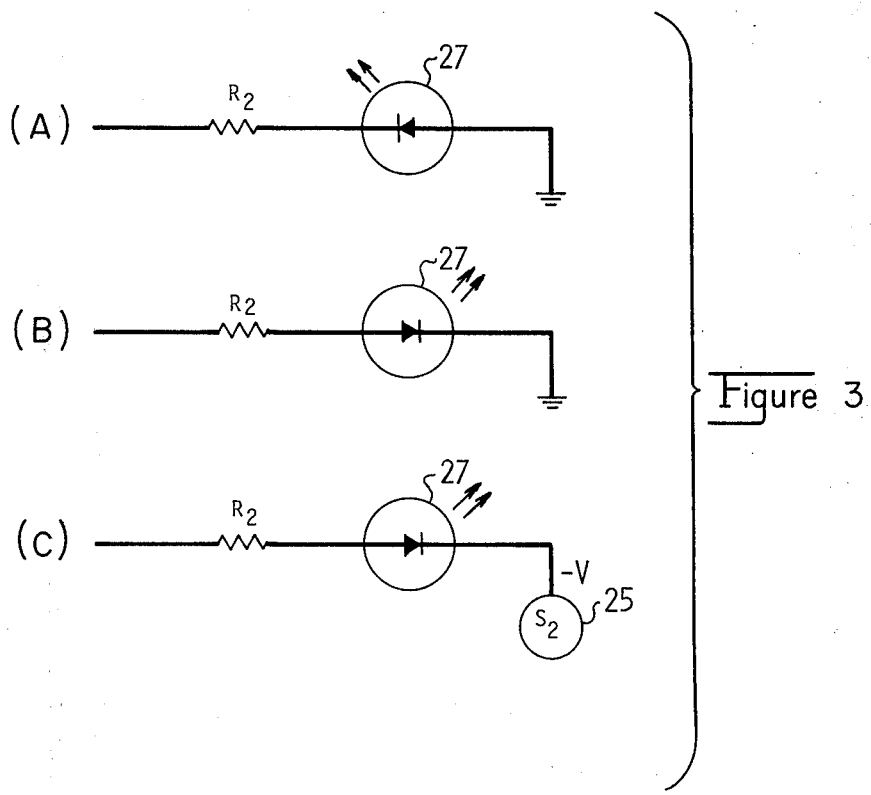
FIG. 3 is a schematic diagram of other possible embodiments of the display circuitry of the circuit of FIG. 1.

FIG. 3 shows other possible display configurations. For FIG. 3(A) when $V_{IN}$11 is positive with respect to $V_{REF}$15, the LED display 27 is on, and when $V_{IN}$ is negative with respect to $V_{REF}$, the LED 27 is off. Conversely, for FIGS. 3(B) and 3(C), when $V_{IN}$ is positive with respect to $V_{REF}$, the LED display 27 is off, and when $V_{IN}$ is negative with respect to $V_{REF}$, the LED 27 is on.

We claim:

1. A circuit for detecting input signals of of positive and negative polarities and displaying a stretched pulse visibly indicating the occurrence of said input signals relative to a reference signal, said circuit comprising:

threshold signal means for providing a threshold signal;

comparator means having an input, a reference and an output terminal, said input terminal being coupled to receive said input signals and said reference terminal being coupled to receive said threshold signal, the comparator means being effective for detecting the level of each of the input signals relative to the level of said reference signal and for producing at said output terminal an output pulse indicative of the input signal level relative to the reference signal level;

pulse stretching means capacitively coupling said output terminal to said reference terminal for providing capacitive feedback of the output pulse, said capacitively fed-back output pulse combining with said threshold signal to form the reference signal, said reference signal being applied to the reference terminal causing the comparator means to produce a stretched output pulse of increased duration in response to the output pulse having a duration shorter than a predetermined value; and display means coupled to the output terminal of said comparator means for producing discretely visible indications of said stretched output pulse.

2. The circuit as in claim 1 wherein said threshold signal means comprises a voltage source, a potentiometer connected across said voltage source for providing a variable voltage, and a resistor coupled to said potentiometer and to the reference terminal of said comparator means.

3. The circuit as in claim 1 wherein said comparator means comprises high-speed ECL-TTL comparator for producing said output pulse in response to said input and said reference signals.

4. The circuit as in claim 3 wherein said display means comprises a resistor and an LED display unit connected in series.

5. The circuit as in claim 4 wherein said display means further comprises a voltage source connected to said LED display unit.

* * * * *